US005649015A

United States Patent [19]

Paddock et al.

[11] Patent Number: 5,649,015

[45] Date of Patent: Jul. 15, 1997

[54] SPEAKER SIMULATOR

[75] Inventors: Thomas L. Paddock, Cupertino; Robert H. Weir, Mill valley, both of Calif.

[73] Assignee: Midnite Kitty, Inc., San Rafael, Calif.

[21] Appl. No.: 529,884

[22] Filed: Sep. 15, 1995

Related U.S. Application Data

[63] Continuation-in-part of Ser. No. 110,914, Aug. 24, 1993.

[51] Int. Cl.[6] .......... H03G 3/00

[52] U.S. Cl. .......... 381/61; 381/62

[58] Field of Search .......... 381/55, 61, 124, 381/111, 116, 117, 62, 64

[56] References Cited

U.S. PATENT DOCUMENTS

| | | | |
|---|---|---|---|
| 3,815,706 | 6/1974 | Nagai | 381/62 |
| 3,821,473 | 6/1974 | Mullins . | |
| 4,107,462 | 8/1978 | Asija | 381/110 |
| 4,256,923 | 3/1981 | Meyers . | |
| 4,573,189 | 2/1986 | Hall . | |
| 4,727,584 | 2/1988 | Hall . | |
| 4,811,403 | 3/1989 | Henricksen et al. | 381/87 |
| 4,860,361 | 8/1989 | Sato et al. | 381/55 |
| 5,029,474 | 7/1991 | Schulze . | |
| 5,117,401 | 5/1992 | Feintuch . | |

FOREIGN PATENT DOCUMENTS

| | | |
|---|---|---|
| 2538073 | 3/1977 | Germany . |

OTHER PUBLICATIONS

Buddingh, Terry, "New Tone Toys: The Demeter SSC-1 & BBE 462", *Guitar Player Magazine,* issue 282, vol. 27, No. 6.

*Primary Examiner*—Curtis Kuntz
*Assistant Examiner*—Pina W. Lee
*Attorney, Agent, or Firm*—Trial & Technology Law Group

[57] ABSTRACT

A speaker simulator receives a high power musical signal from a power amplifier, and a reduced power signal is extracted by a pad circuit and directed to a high-pass filter and a fan circuit which drives a cooling fan. The output of the high-pass filter is directed to a servo amplifier and a series of notch filters, prior to output from the speaker simulator. The angular momentum of the blades of the cooling fan provides an history-dependent impedance, i.e., an impedance dependent on the past values of the signal driving the fan. The history-dependent impedance produces an aesthetically pleasing distortion of the speaker simulator output.

8 Claims, 8 Drawing Sheets

SPEAKER SIMULATOR

RELATED APPLICATIONS

This application is a continuation-in-part of pending application Ser. No. 08/110,914, filed Aug. 24, 1993.

BACKGROUND OF THE INVENTION

1. Field of the Invention

The present invention is related to speaker simulators that utilize mechanical systems to simulate the distortion to a sound system caused by a speaker cabinet.

2. Prior Art

The sounds of electrically amplified instruments are greatly affected by the associated amplification circuitry and speakers, i.e., the amplifier/speaker system. In fact, many rock musicians have strong preferences for certain types of amplifier/speaker systems for their effects on musical signals. For instance, many rock guitarists prefer amplifiers which use tube circuitry rather than solid state circuitry since the distortion produced by tubes differs from that produced by transistors. Rock musicians also tend to prefer certain brands of amplifier/speaker systems for the characteristics which these systems add to the sound. Furthermore, many musicians prefer the sound characteristics added to a musical signal when an amplifier/speaker system is generating a high volume output.

However, it is not always convenient to generate loud music through an amplifier/speaker system, or to monitor the output of the amplifier/speaker system through a microphone. For instance, in a recording session it is desirable to isolate the sounds produced by each musician so as to be able to control the final mix down. If many musicians are playing through loud amplifier/speaker systems then it becomes necessary to acoustically isolate the musicians. This can be technically difficult and unconducive to providing an ensemble feeling to the musicians.

When bands are performing in concert it is also technically difficult to monitor the output of the amplifier/speaker system of each musician while maintaining isolation between the systems. Some rock bands are known to run the output from the electrical instruments in the concert hall to large vans parked outside where the music is played through an amplifier/speaker system, monitored with a microphone, and brought back into the concert hall for a final stage of amplification before being played over the loudspeakers. Such measures are of course expensive and inconvenient.

To generate a signal impressed with the characteristics of a loud amplifier/speaker system while producing a minimum amount of noise some manufacturers, such as Demeter of Santa Monica, Calif., have introduced sound insulating enclosures which contain speakers and a microphone. When the speakers are producing high volume acoustical signals the microphone signal has the characteristics of sounds produced by a loud sound system. However, a minimum amount of sound leaks from the enclosure. Disadvantages of this system include the added expense of a sound insulating enclosure and a microphone, and the unnatural effect of the short delay times from reverberations of the sound off the inside walls of the enclosure.

Other manufacturers provide electrical sound processing systems which simulate the characteristics of loud amplifier/speaker systems using digital electronics. Because of the complexity of the characteristics of amplifier/speaker sound systems, such simulation systems are somewhat inadequate. Distortion effects produced by speakers include: "driving force distortion" produced by the movement of the voice coil out of the homogeneous region of the field produced by the magnet; "support system distortion" produced by nonlinearities in the elasticity of the suspension system for the speaker cone; "air distortion" produced by the nonlinearity in the compressibility of air at high pressures; and "frequency-modulation distortion" produced by the low-frequency motion of the speaker cone affecting the high-frequency output of the cone. Since these types of distortion are nonlinear they cannot be simulated by digital techniques such as linear filtering.

SUMMARY OF THE INVENTION

The present invention simulates a speaker system by coupling the electrical filters of the speaker simulator to a cooling fan. Because the cooling fan is a complicated mechanical system, this connection provides a complex and interesting history-dependent impedance. The impedance of the fan is dependent on the moment of inertia of the fan blades, the current angular velocity of the fan blades, and other particulars of the construction of the fan and its motion. The speaker simulator of the present invention may be connected to any amplifier/speaker system.

It is therefore an object of the present invention to provide a system for adding aesthetically pleasing distortion to a musical signal.

It is another object of the present invention to provide a system for simulation of the effects of a loud amplifier/speaker system on a musical signal.

It is another object of the present invention to provide a system for simulation of the effects of the coupling of a speaker cone to an electrical sound amplification system.

It is another object of the present invention to provide a system for simulation of the effects of the coupling of a speaker cone to an electrical sound amplification system by coupling the electrical sound amplification system to a mechanical system having linear and/or angular momentum.

It is another object of the present invention to provide an amplifier/speaker simulator which does not need to generates a high sound level.

It is another object of the present invention to provide a system which allows multiple musicians to play electrical instruments in close proximity while providing good isolation between the signals produced by the instruments.

It is another object of the present invention to provide an amplifier/speaker simulator which requires a minimum of circuitry.

It is another object of the present invention to provide an amplifier/speaker simulator which requires a minimum of equipment.

Other objects and advantages of the present invention will become apparent from a reading of the detailed description or by practice of the present invention.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
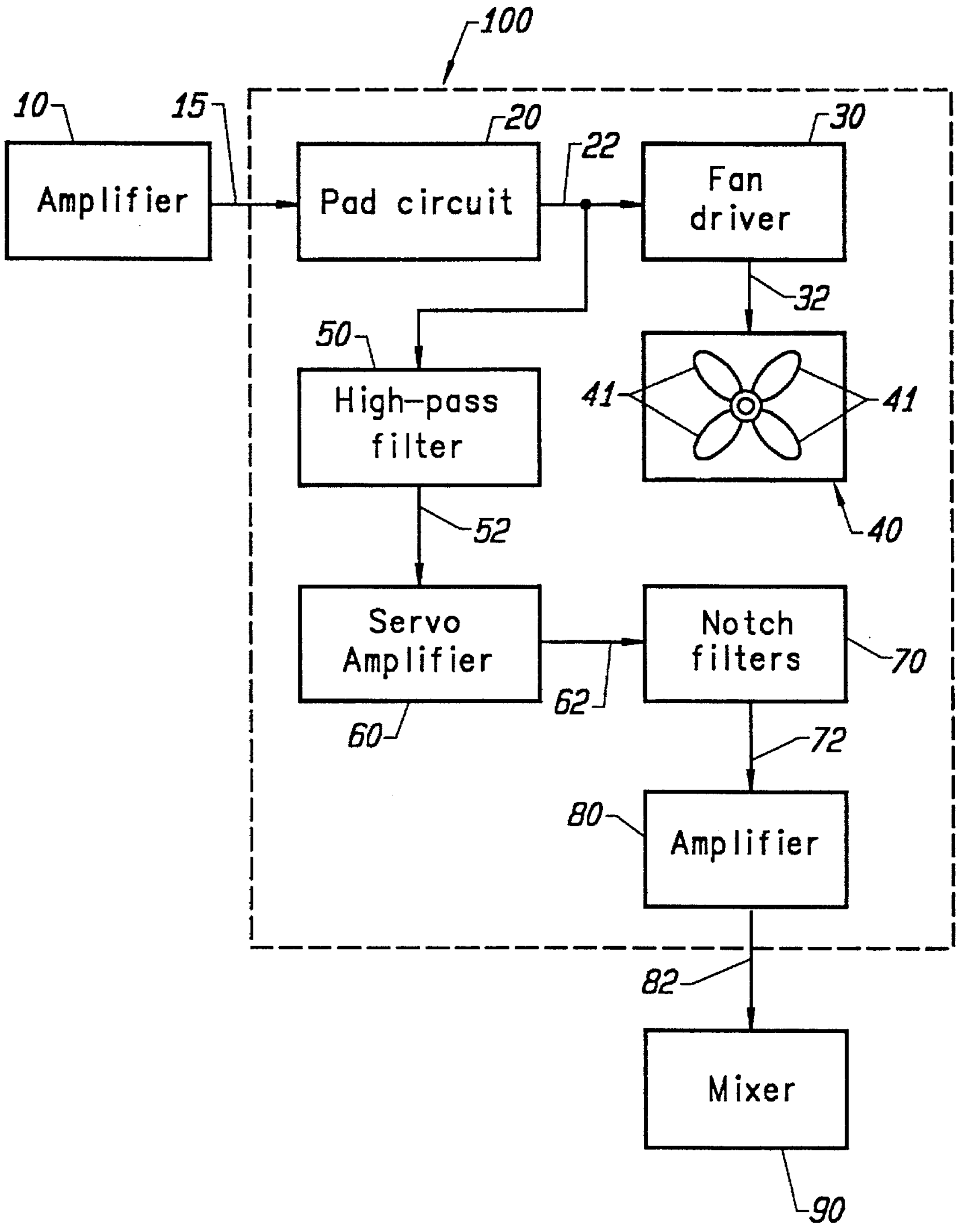
FIG. 1 is a block diagram of the components of the system of the present invention with associated external amplification and mixing circuitry.

The preferred embodiments are apparatus for simulating the effects of an amplifier/speaker system on a sound signal. As shown in FIG. 1, the speaker simulator 100 of the present invention consists of a pad circuit 20, a fan driver 30, a direct current powered cooling fan 40, a high-pass filter 50, a servo amplifier 60, a set of notch filters 70, and a post amplifier 80. An amplifier 10 provides a high-power input signal 15 to the speaker simulator 100. Commonly, the high-power input signal 15 would be directed to a speaker cabinet such as a Soldano 2×12 cabinet having two twelve-inch speakers (manufactured by Soldano Corporation of Seattle, Wash.), a Marshal JCM series 4×12 cabinet having four twelve-inch speakers (manufactured by Marshal corporation of Westbury, N.Y.). However, according to the present invention, the input signal 15 is directed to a system 100 which is meant to simulate such speaker cabinets.

The high-power input signal 15 is received by a pad circuit 20 which produces a reduced-power signal 22 proportional to the high-power input signal 15. The pad circuit 20 may be simply a resistive load. Commonly, an 8 ohm load is required for proper impedance matching to the amplifier 10.

The reduced power signal 22 is directed to the fan driver 30 and the high-pass filter 50. The fan driver 30 acts as a rectifier and a regulator, and provides a fan drive signal 32. In the preferred embodiment of the present invention the fan driver 30 is the LM317 chip manufactured by National Semiconductor of Sunnyvale, Calif. In an alternate embodiment, the fan driver 30 may simply be a rectifier such as a rectifying diode (a half-wave rectifier) or a rectifying bridge (a full-wave rectifier).

The fan drive signal 32 powers the dc fan 40, causing the blades 41 of the cooling fan 40 (Elina cooling fan model SDC40-12H manufactured by Sangy Co. Ltd. of Japan) to rotate. The rotating fan blades 41 drive a flow of air across the pad circuit 20, increasing the rate of heat dissipation from the pad circuit 20. The amplifier 10 will be rated in the neighborhood of 100 watts, and some means of cooling the pad circuit 20 is often used. In the preferred embodiment of the present invention, the pad circuit 20 and cooling fan 40 will not overheat even when the input signal 15 reaches up to 200 watts.

The high-pass filter 50 is a 3-pole filter with a 90 Hz cutoff which receives the reduced power signal 22 and removes spurious low frequency components such as 60 Hertz "hum" produced by electromagnetic interference from power lines. If the speaker simulator circuit 100 is designed to process a signal generated by an electric guitar then the cutoff frequency for the high-pass filter 50 must be below the frequency of the lowest note on the electric guitar, i.e., an E two octaves below middle C. Similarly, if the speaker simulator circuit 100 is designed to process a signal generated by an electric piano then the cutoff frequency for the high-pass filter 50 should be below the frequency of the lowest note on the electric piano.

The output 52 of the high-pass filter 50 is directed to a servo amplifier 60 such as the Jensen Twin Servo microphone preamplifier (manufactured by Jensen Transformers Incorporated of North Hollywood, Calif.). Servo amplifiers are d.c. amplifiers that are not a.c. coupled in the audio path, and use feedback to compensate for d.c. voltage offsets in the output. The advantage of servo amplifiers is that they provide little distortion in the low frequencies and have little phase distortion. The output 62 of the servo amplifier 60 is directed to a Roland GE21 filter 70 (manufactured by Roland Corporation, Japan) which has twenty-one notch filters which may be adjusted according to the aesthetics of the musician. (The preferred embodiments provide at least five notch filters for the musician to adjust to suit his preferences.) The filtered output 72 from the notch filters 70 is directed to a post amplifier 80 which is also a Jensen Twin Servo microphone preamplifier. The output sound signal 82 from the post amplifier 80 is output from the speaker simulator 100, and is typically directed to a mixer 90. The mixer 90 may also receive musical signals from a number of other instruments (possibly also having been processed by the speaker simulator 400 of the present invention) and mixes them together to provide a stereo or mono signal suitable for recording or for broadcasting over a public address system to a live audience.

The electrical coupling of the fan 40 into the speaker simulator circuit 100 provides an impedance load that is history dependent and has interesting and aesthetically pleasing effects on the output sound signal 82. The blades 41 of the fan provide a "throw weight" 41 that has an angular momentum that varies as a function of time according to the present value fan drive signal 32 and the recent past values of the fan drive signal 32. When there is an increase in the magnitude of the fan drive signal 32 the angular momentum of the throw weight 41 resists the increased torque. This resistance affects the reduced power signal 22 which is passed on to the high-pass filter 50, and ultimately heard, by absorbing some extra energy from the signal 22. Similarly, when there is a decrease in the magnitude of the fan drive signal 32 the angular momentum of the throw weight 41 resists the decreased torque by supplying some of the kinetic energy from the throw weight 41 to the signal 22.

Therefore, the fan 40 acts somewhat similar to a low-pass filter. However, the resistance provided by the fan 40 is not only a function of the moment of the inertia of the throw weight 41, it is also a function of the speed at which the throw weight 41 is rotating. Since the speed at which the throw weight 41 is rotating is dependent on the history of the fan drive signal 32, the low-pass filtering of the fan is history dependent.

Alternatively, the history-dependent effects of a speaker cabinet may be simulated using a mechanical system with a throw weight or mass that moves linearly, rather than having a throw weight that rotates. For instance, the throw weight may be mounted on a spring and attached to a magnet, and an inductor in the sound processing circuit may generate a magnetic field which induces a force on the throw weight. In fact, the inductor may be a speaker coil, and the throw weight may be a speaker magnet. Because of the similarity of this system to a speaker, it is expected that the distortions produced by this system are similar to those produced by a speaker. If the throw weight is attached to the arm of a bellows, then the coupling to the throw weight can function to cool the system, just as in the above-described system incorporating a cooling fan.

Figure 2:
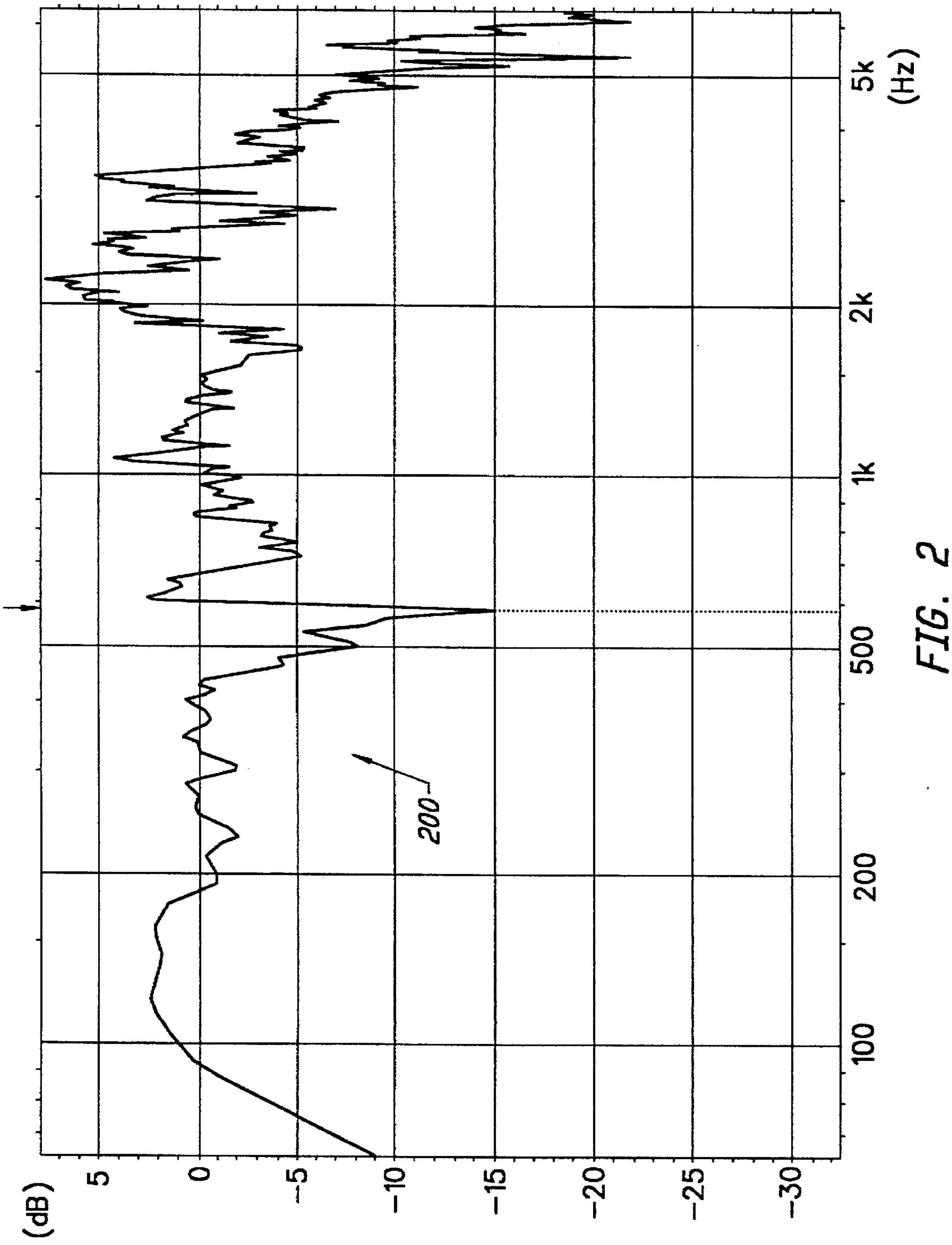
FIG. 2 shows the frequency response from a Soldano cabinet with two 12" speakers monitored by a Shure SM57 microphone.
Figure 3:
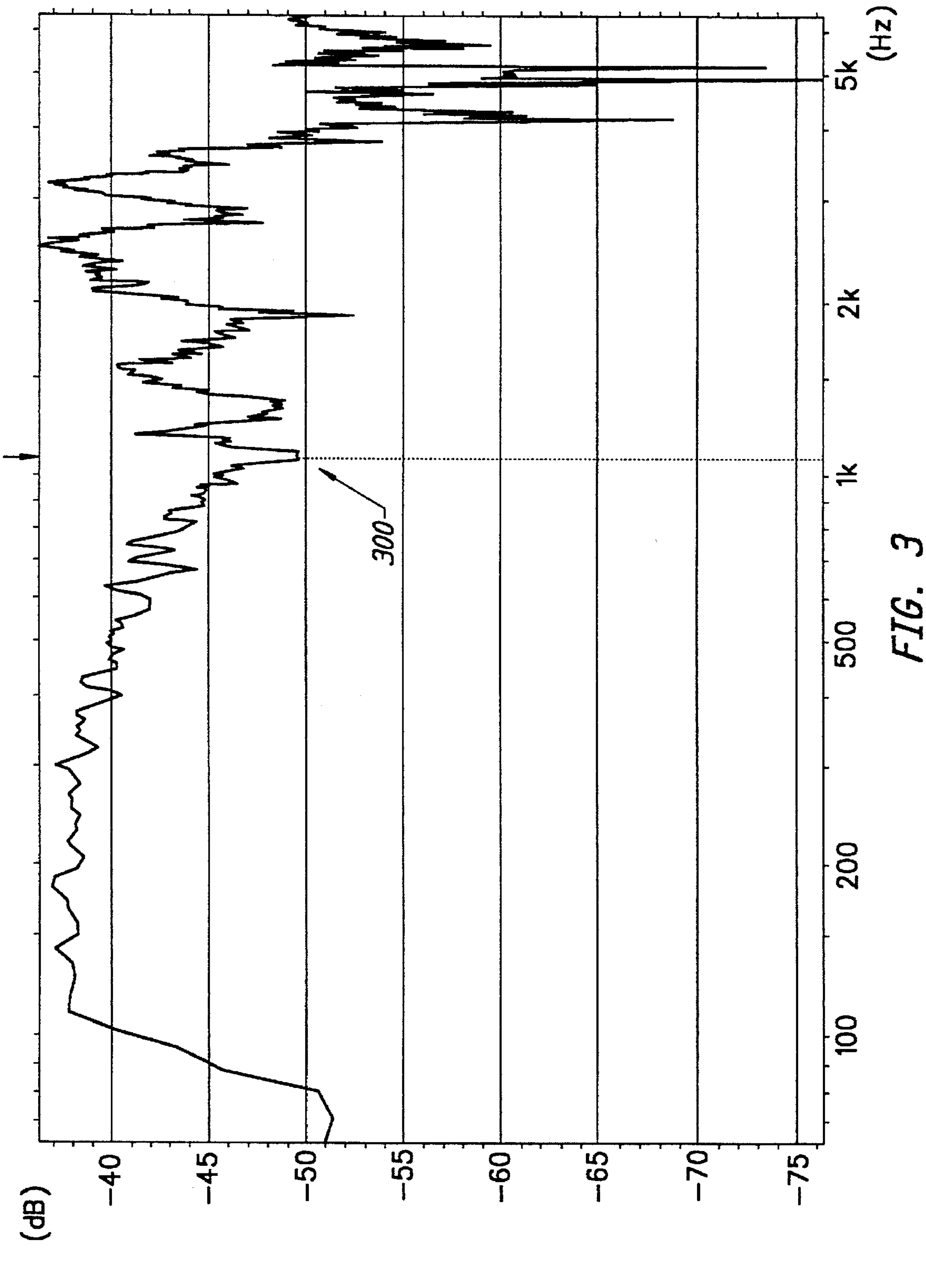
FIG. 3 shows the frequency response from a Marshal cabinet with two 12" speakers monitored by a Shure SM57 microphone.
Figure 4:
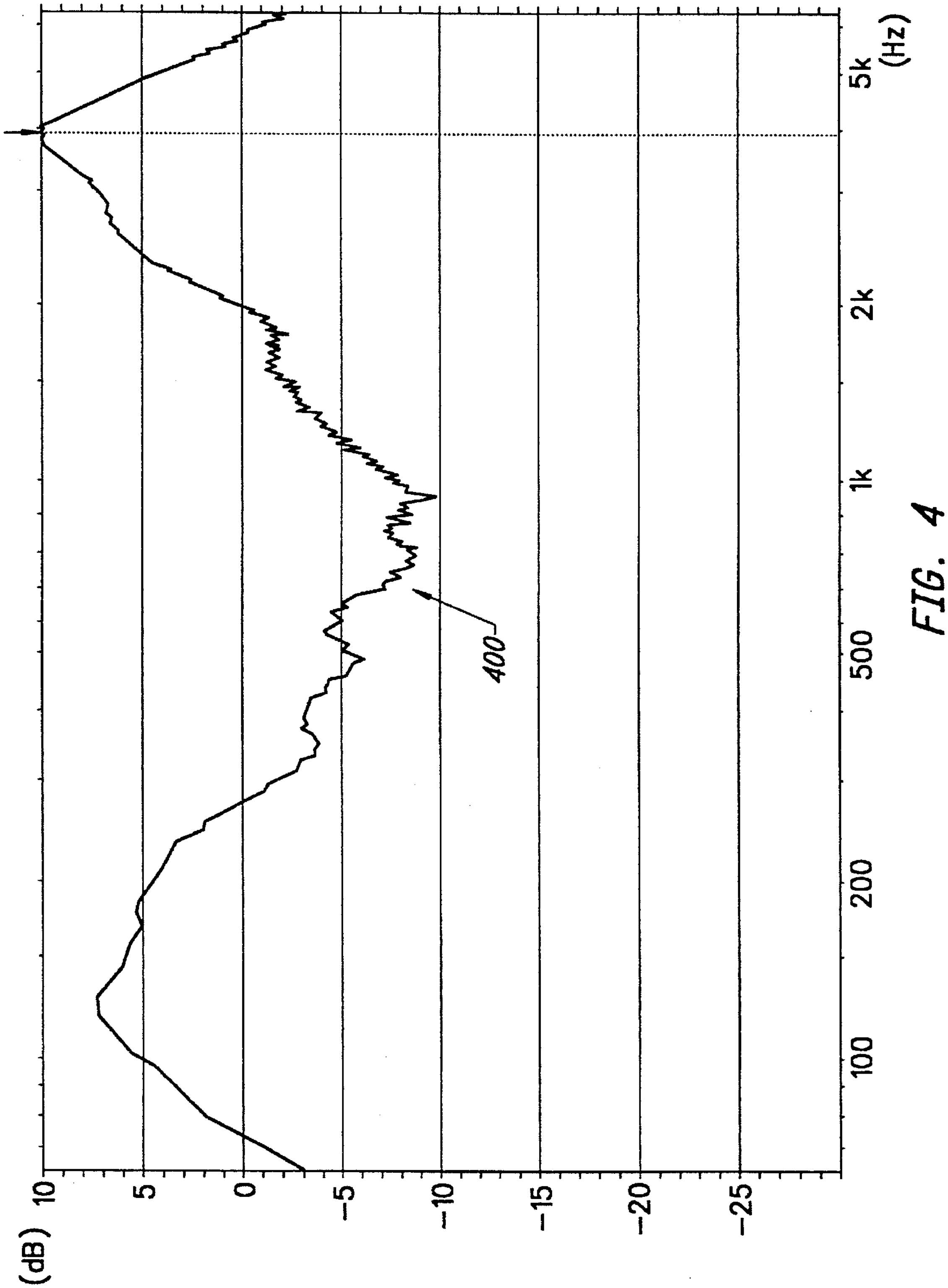
FIG. 4 shows the frequency response from the speaker simulator of the present invention.

FIG. 2 shows the frequency response 200 of the acoustic output from a Soldano™ cabinet with two 12" speakers monitored by a Shure SM57 microphone (manufactured by Shure Brothers Incorporated of Evanston, Ill.) in Hertz versus decibels. FIG. 3 shows the frequency response 300 of the acoustic output from a Marshal™ cabinet with four 12" speakers monitored by a Shure SM57 microphone in Hertz versus decibels. FIG. 4 shows the frequency response 400 from the system of the present invention in Hertz versus decibels. It should be noted that several of the prominent features of the frequency response spectra 200, 300 and 400 of FIGS. 2, 3, and 4, respectively, are the same. For instance, each of the spectra 200, 300 and 400 have a broad peak at around 150 Hz and have a minimum at around 600–700 Hz. Furthermore, the spectra 200, 300 and 400 display more fine structure above 700 Hz than below 700 Hz, and drop sharply in amplitude beginning at 3000–4000 Hz.

However, the frequency response spectra 200 and 300 from the Soldano and Marshal cabinets of FIGS. 2 and 3 share some features that the frequency response spectrum 400 of the speaker simulator of the present invention of FIG. 4 does not have. For instance, the frequency response spectra 200 and 300 of FIGS. 2 and 3 have more fine structure below 600–700 Hz than the frequency response spectrum 400 of FIG. 4. More strikingly, above 600–700 Hz the Soldano and Marshal cabinets' frequency responses 200 and 300 display much larger peaks and valleys than the speaker simulator frequency response 400.

Figure 5:
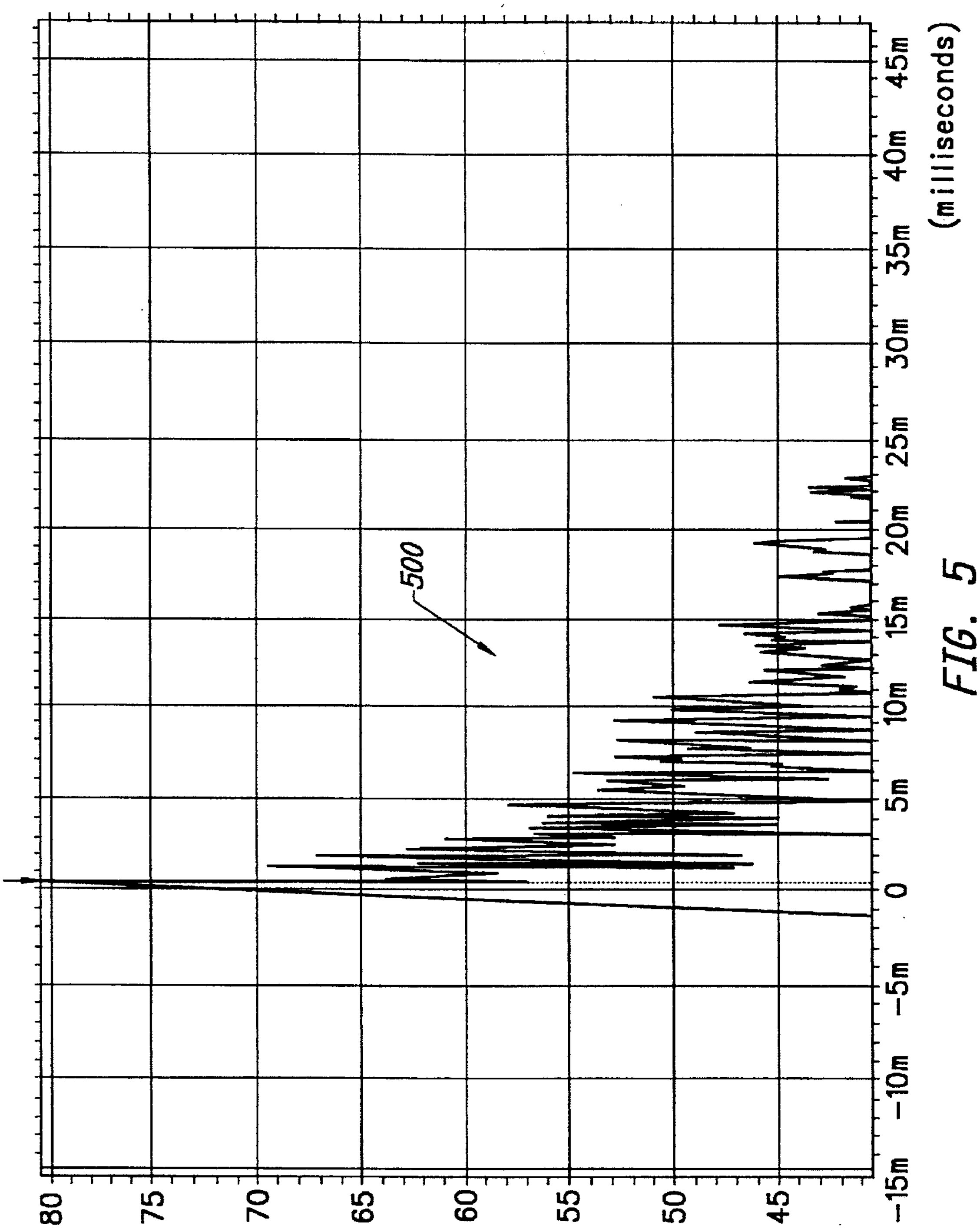
FIG. 5 shows the impulse response from the Soldano cabinet with two 12" speakers.
Figure 6:
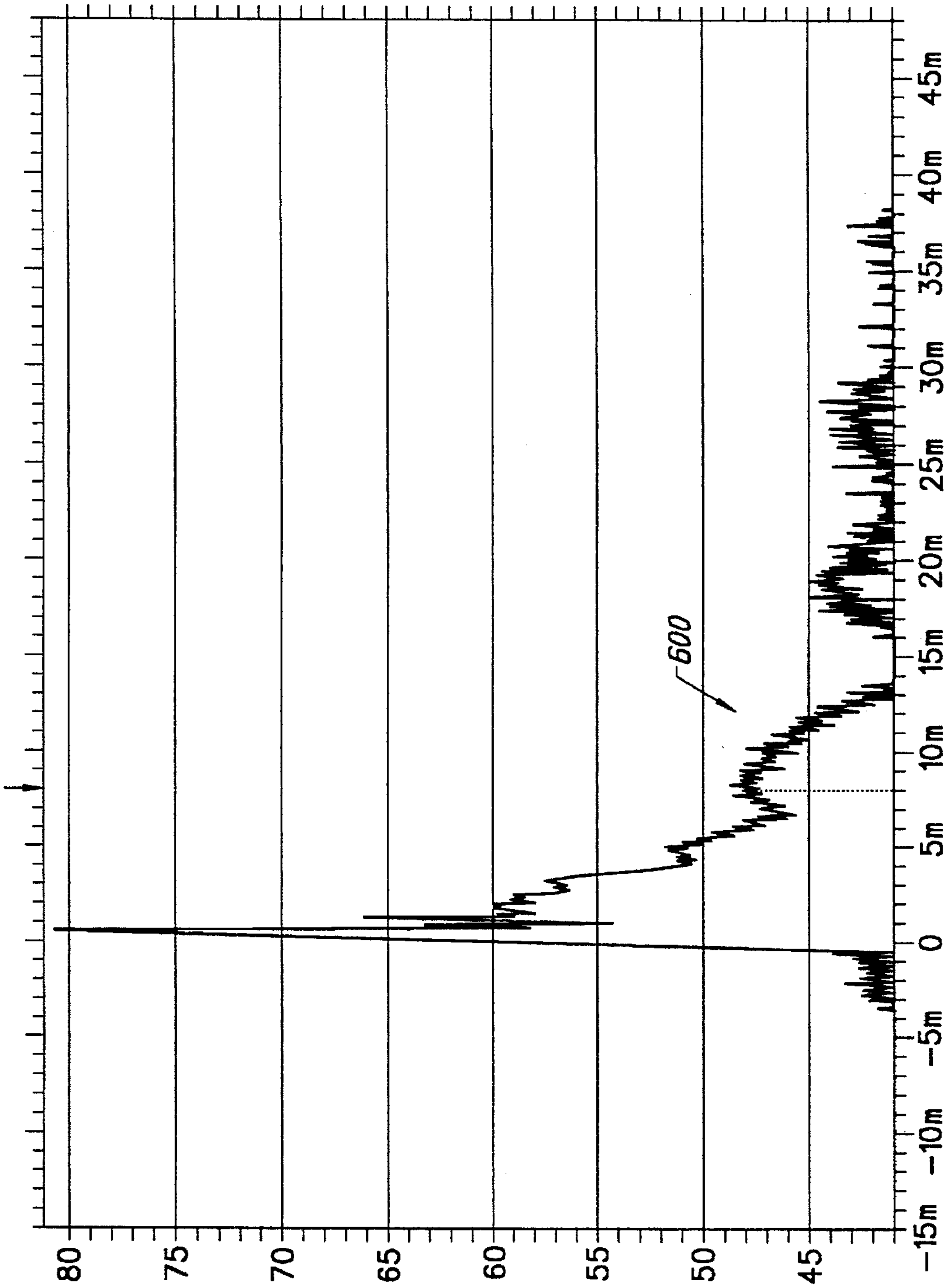
FIG. 6 shows the impulse response of the speaker simulator of the present invention.

FIG. 5 shows the impulse response 500 of the acoustic output from a Soldano cabinet with two 12" speakers, and FIG. 6 shows the impulse response 600 from the system of the present invention, in milliseconds versus an arbitrary magnitude scale. Whereas both impulse responses 500 and 600 decay to zero, the impulse response 600 from the present invention has a longer decay time than the impulse response 500 from the Soldano cabinet. The impulse response 500 from the Soldano cabinet decays to zero in approximately 25 milliseconds, whereas the impulse response 600 from the present invention takes almost 40 milliseconds to decay to zero.

It can also be seen from FIG. 5 that a frequency component with a period of approximately 0.5 milliseconds, i.e., the component at approximately 2000 Hz, has a large amplitude in the impulse response 500 from the Soldano cabinet. Interestingly, on reference back to FIG. 2, it may be noted that the frequency response 200 of the Soldano cabinet has a maximum in the frequency response 400 at around 2000 Hz. Also, as shown in FIG. 6, the impulse response 600 from the present invention has a large frequency component with a period of approximately 0.25 milliseconds, and on reference back to FIG. 4 it may be noted that the maximum in the frequency response 400 of the present invention occurs at about 4000 Hz.

Figure 7:
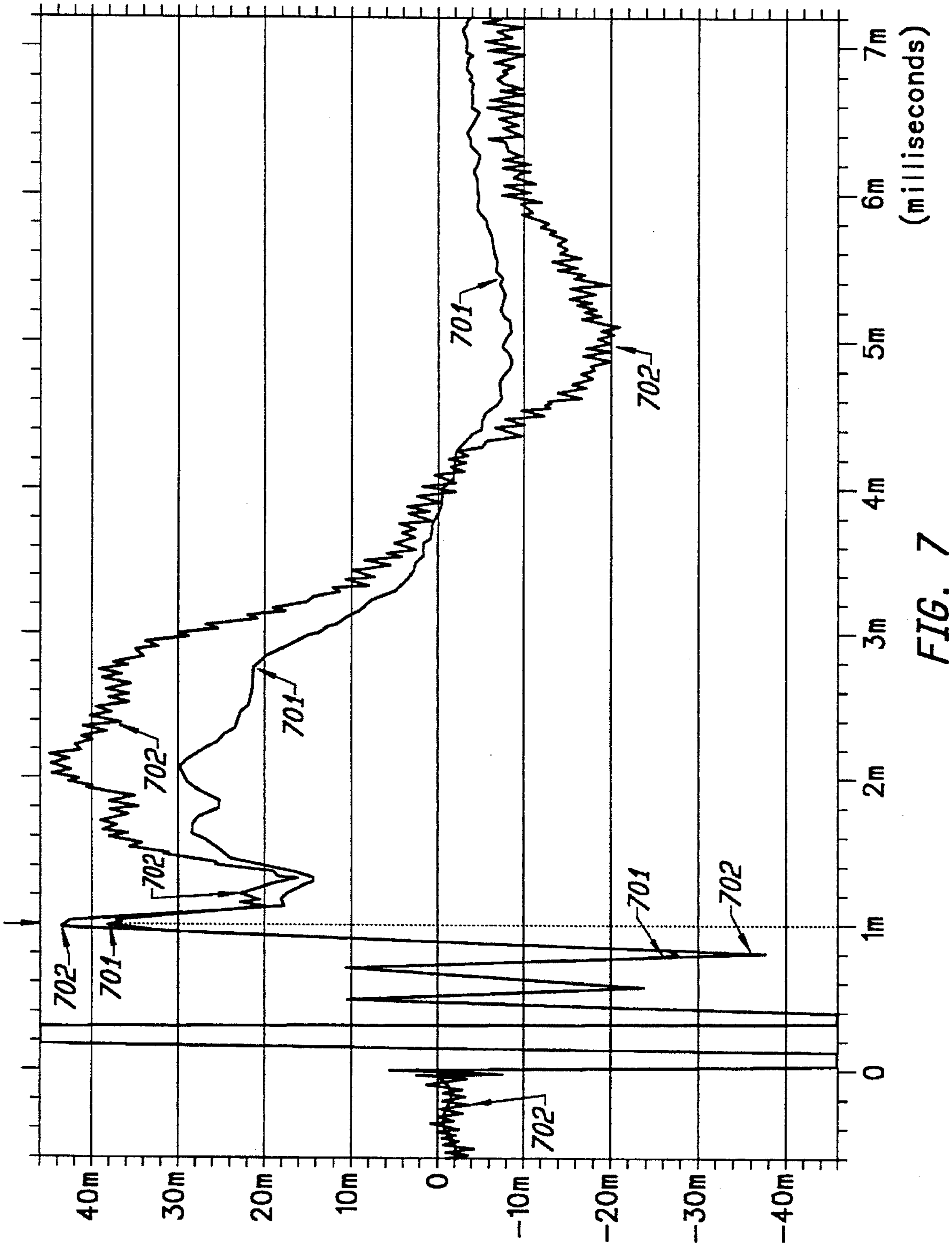
FIG. 7 provides a comparison of the impulse response from the system of the present invention when the impulse is not preceded by a signal, and when the impulse is preceded by a sinusoidal signal which terminates one second prior to the impulse.
Figure 8:
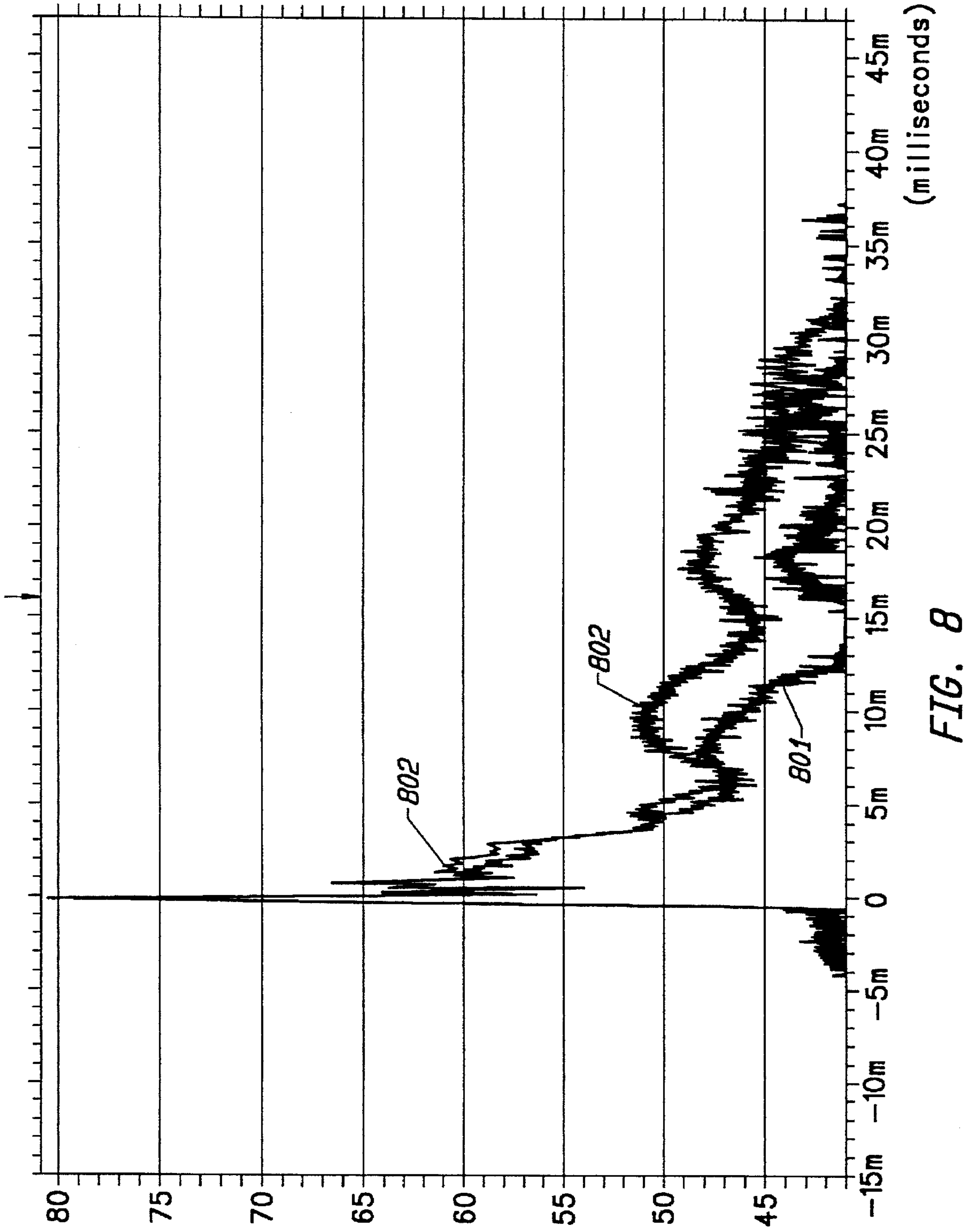
FIG. 8 shows a plot of impulse responses as in FIG. 7, though over a longer time interval than shown in FIG. 7.

The history dependence of the response of the system of the present invention is illustrated by the plots of FIGS. 7 and 8. In FIG. 7 there is shown an impulse response 701 when no signal precedes the impulse, and an impulse response 702 when the impulse is preceded by a 1 kHz sinusoid which terminates approximately one second before the impulse, in milliseconds versus an arbitrary magnitude scale. A remnant of the sinusoidal signal is apparent as noise with a characteristic frequency of around 17 kHz in the first millisecond before the impulse (which occurs at time zero). Whereas the two impulse responses 701 and 702 are substantially the same for the first millisecond, subsequently the impulse responses 701 and 702 are quite different. The response 702 from the impulse preceded by a sinusoid still has a frequency component at around 17 kHz. This 17 kHz component is not apparent in the response 701 that is not preceded by a sinusoid. On a coarser time scale, the response 702 preceded by the sinusoid has a larger absolute value than the response 701 which is not preceded by a signal. Both responses 701 and 702 have a zero crossing at about 4.2 milliseconds.

FIG. 8 provides a comparison of an impulse response 801 when no signal precedes the impulse, and an impulse response 802 when the impulse is preceded by a 1 kHz sinusoid which terminates approximately one second before the impulse, over a longer time period than that shown in FIG. 7. (The plot of FIG. 8 is again in milliseconds versus the arbitrary magnitude scale of FIG. 7.) Again, the two responses 801 and 802 are substantially the same for the first millisecond, and subsequently the response 802 from the impulse preceded by the sinusoid has a greater magnitude than the response 801 from the impulse which is not preceded by a signal.

Although the effects of the system of the present invention are clearly shown by comparison of the frequency spectra of FIGS. 2, 3 and 4 and the impulse response of FIGS. 5, 6, 7 and 8, it must be emphasized that the most important test of the speaker simulator of the present invention is how it sounds to the human ear. In this respect the success of the system of the present invention is most striking (especially when contrasted with other speaker cabinet simulation techniques such as digital signal processing) since the system provides a particularly pleasing speaker-like distortion of a signal, particularly when that signal is generated by an electric guitar.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. Other variations within the scope of the present invention include: other types of notch filters may be used; the set of notch filters may have more or less bands; another type of servo amplifier may be used; the high-pass filter, servo amplifier, and/or notch filters need not be included in the circuit; the drive signal to the cooling fan need not be rectified; the throw weight may move linearly rather than rotate; the throw weight need not be mechanically connected to a cooling system for the pad circuit; etc.

The embodiments described herein were chosen to best explain the principles of the invention and its practical application, to thereby enable others skilled in the art to best utilize the invention and various embodiments with various modifications as are suited to the particular use contemplated. It is therefore intended that the scope of the invention be defined by the claims appended hereto and their equivalents.

What is claimed is:

1. A speaker simulator for producing distortion of a musical input signal, comprising:

a pad circuit for producing a reduced power signal from said musical input signal directed to said pad circuit;

a fan driver circuit for transforming said reduced power signal to a fan driver signal;

a cooling fan powered by said fan driver signal, said cooling fan forcing air across said pad circuit to cool said pad circuit, said cooling fan providing an impedance dependent on a present value of said reduced power signal and a history of said reduced power signal such that said reduced power signal is distorted.

2. The speaker simulator of claim 1 further including:

an amplifier for amplification of said reduced power signal; and filters for filtering said reduced power signal.

3. The speaker simulator of claim 2 wherein said amplifier is a servo amplifier.

4. A speaker simulator for producing a musical output signal which is a distorted version of a musical input signal, comprising:

a housing;

a pad circuit mounted in said housing for producing a low power pad output signal from said musical input signal directed to said pad circuit;

a throw weight movably restrained to said housing;

a transducer mounted to said housing for transducing a first portion of said low power pad output signal into motion of said throw weight; and means for outputting a second portion of said low power pad output signal as said musical output signal.

5. The speaker simulator of claim 4 wherein said throw weight is movably restrained to rotate.

6. The speaker simulator of claim 4 wherein said throw weight is movably restrained to move linearly.

7. The speaker simulator of claim 4 wherein said throw weight is movably restrained by a spring.

8. The speaker simulator of claim 4 wherein said means for outputting includes an amplifier and a filter.

* * * * *